(12) United States Patent
Latoria et al.

(10) Patent No.: US 8,018,223 B2
(45) Date of Patent: Sep. 13, 2011

(54) POSITION DETECTION UTILIZING A ROTARY ARRAY OF MAGNETIC SENSORS WITH IRREGULAR SPACING BETWEEN SENSING ELEMENTS

(75) Inventors: Michael J Latoria, Hampshire, IL (US); Anthony M. Dmytriw, Freeport, IL (US); Lamar F. Ricks, Lewis Center, OH (US)

(73) Assignee: Honeywell International Inc., Morristown, NJ (US)

( * ) Notice: Subject to any disclaimer, the term of this patent is extended or adjusted under 35 U.S.C. 154(b) by 173 days.

(21) Appl. No.: 12/126,752

(22) Filed: May 23, 2008

(65) Prior Publication Data

US 2008/0284416 A1 Nov. 20, 2008

Related U.S. Application Data

(63) Continuation of application No. 11/227,411, filed on Sep. 14, 2005, now Pat. No. 7,408,343, and a continuation-in-part of application No. 11/088,104, filed on Mar. 23, 2005, now Pat. No. 7,112,962, and a continuation-in-part of application No. 10/993,964, filed on Nov. 18, 2004, now Pat. No. 7,173,414.

(51) Int. Cl.
*G01B 7/30* (2006.01)
*G01R 33/09* (2006.01)

(52) U.S. Cl. ................... 324/207.25; 324/252

(58) Field of Classification Search .......... 324/173–174, 324/207.2, 207.21, 207.25, 252; 73/514.16, 73/514.31, 514.39; 338/32 R, 32 H
See application file for complete search history.

(56) References Cited

U.S. PATENT DOCUMENTS

| | | | |
|---|---|---|---|
| 5,351,003 A | 9/1994 | Bauer et al. | |
| 5,358,088 A | 10/1994 | Barnes et al. | |
| 5,430,374 A | 7/1995 | Metz | |
| 5,497,084 A | 3/1996 | Bicking | |
| 5,589,769 A | 12/1996 | Krahn | 324/207.26 |
| 5,750,270 A * | 5/1998 | Tang et al. | 428/611 |
| 6,097,183 A | 8/2000 | Goetz et al. | 324/207.12 |
| 6,445,176 B1 | 9/2002 | Wallrafen | |
| 6,509,732 B1 | 1/2003 | Rhodes et al. | 324/207.12 |

(Continued)

FOREIGN PATENT DOCUMENTS

WO 9953266 10/1999

(Continued)

OTHER PUBLICATIONS

Honeywell International Inc., 1- and 2- Axis Magnetic Sensors HMC1001/1002 1021/1022, Apr. 2000.*

*Primary Examiner* — Bot L LeDynh
(74) *Attorney, Agent, or Firm* — Seager Tufte & Wickhem LLC

(57) ABSTRACT

A magnetoresistive sensor system includes a plurality of chip carriers, such that each integrated circuit among the plurality of chip carriers is associated with a respective magnetoresistive sensing components. A plurality of magnetoresistive sensing components can be arranged in a rotary array, wherein each magnetoresistive component among the plurality of magnetoresistive components is associated with a respective integrated circuit among the plurality of chip carriers and wherein the plurality of magnetoresistive sensing components comprises sensing components that are spaced irregular from one another in order to optimize the performance of the rotary array and meet requirements of a particular magnetoresistive sensing application.

18 Claims, 16 Drawing Sheets

U.S. PATENT DOCUMENTS

| | | |
|---|---|---|
| 6,638,691 B2 * | 10/2003 | Kang et al. .................... 430/313 |
| 6,674,280 B1 | 1/2004 | Goetz et al. |
| 6,731,108 B2 | 5/2004 | Zalunardo et al. ......... 324/207.2 |
| 6,750,644 B1 | 6/2004 | Berkcan |
| 6,757,635 B2 | 6/2004 | Topmiller .................... 702/150 |
| 6,806,702 B2 | 10/2004 | Lamb et al. .............. 324/207.25 |
| 6,972,559 B2 | 12/2005 | Bartingale et al. |
| 6,984,978 B2 | 1/2006 | Wan et al. |
| 7,030,604 B1 | 4/2006 | Dmytriw et al. |
| 7,126,327 B1 | 10/2006 | Busch |
| 7,141,967 B2 * | 11/2006 | Butzmann .................... 324/252 |
| 7,173,413 B2 * | 2/2007 | Kurumado .............. 324/207.21 |
| 7,173,414 B2 | 2/2007 | Ricks et al. |
| 7,208,940 B2 | 4/2007 | Withanawasam et al. |
| 7,408,343 B2 | 8/2008 | Dmytriw et al. |
| 7,449,882 B2 * | 11/2008 | Witcraft et al. ................ 324/252 |
| 2002/0167310 A1 * | 11/2002 | Wallner et al. ........... 324/207.25 |
| 2003/0076090 A1 | 4/2003 | Muth |
| 2003/0158681 A1 * | 8/2003 | Walter et al. .................... 702/85 |
| 2004/0070390 A1 * | 4/2004 | Lamb et al. .............. 324/207.21 |
| 2004/0207392 A1 | 10/2004 | Kernhof |
| 2007/0001668 A1 | 1/2007 | Mock et al. |

FOREIGN PATENT DOCUMENTS

| | | |
|---|---|---|
| WO | 0177622 | 10/2001 |
| WO | 02065148 | 8/2002 |

* cited by examiner

POSITION DETECTION UTILIZING A ROTARY ARRAY OF MAGNETIC SENSORS WITH IRREGULAR SPACING BETWEEN SENSING ELEMENTS

CROSS-REFERENCE TO RELATED PATENT APPLICATION

This patent application is a continuation of U.S. patent application Ser. No. 11/227,411, entitled "Position Detection Utilizing an Array of Magnetic Sensors With Irregular Spacing Between Sensing Elements," which was filed on Sep. 14, 2005, now U.S. Pat. No. 7,408,343, which is incorporated herein by reference, and is a continuation-in-part of U.S. patent application Ser. No. 10/993,964 filed Nov. 18, 2004, now U.S. Pat. No. 7,173,414, and is a continuation-in-part of U.S. patent application Ser. No. 11/088,104 filed Mar. 23, 2005, now U.S. Pat. No. 7,112,962.

TECHNICAL FIELD

Embodiments are generally related to sensor methods and systems. Embodiments are also related to position detection devices. Embodiments are additionally related to magnetic sensors. Embodiments also relate to methods and systems for linear and rotary sensing applications. Embodiments additionally relate to thermal compensation methods and systems.

BACKGROUND

Magnetoresistive (MR) array technology is utilized in a variety of commercial, consumer and industrial detection applications. In some conventional MR systems an apparatus can be provided for determining the position of a member movable along a path. In such a device, a magnet can be attached to the movable member and an array of magnetic field transducers are located adjacent the path. As the magnet approaches, passes and moves away from a transducer, the transducer provides a varying output signal, which can be represented by a single characteristic curve that is representative of any of the transducers.

To determine the position of the movable member, the transducers are electronically scanned and data is selected from a group of transducers having an output that indicates relative proximity to the magnet. A curve-fitting algorithm can then be utilized to determine a best fit of the data to the characteristic curve. By placement of the characteristic curve along a position axis, the position of the magnet and therefore the movable member may be determined.

In another conventional MR device, a position determining apparatus can be implemented, which includes a magnet that is attached to a movable member that moves along a predefined path of finite length. An array of magnetic field transducers can be located adjacent the predefined path. The transducers can provide an output signal as the magnet approaches passes and moves away from each transducer. A correction mechanism can also be provided to correct for residual error caused by the non-linearity of the transducers.

Such a correction mechanism preferably approximates the residual error with a predetermined function, and applies correction factors that correspond to the predetermined function to offset the residual error. By correcting for the non-linearity of the transducers, the length of the magnet may be reduced and/or the spacing of the transducers may be reduced.

An example of a conventional magnetic sensing approach is disclosed, for example, in U.S. Pat. No. 5,589,769, "Position Detection Apparatus Including a Circuit for Receiving a Plurality of Output Signal Values and Fitting the Output Signal Values to a Curve," which issued to Donald R. Krahn on Dec. 31, 1996, and is assigned to Honeywell International Inc. Another example of a magnetic sensing approach is disclosed in U.S. Pat. No. 6,097,183, "Position Detection Apparatus with Correction for Non-Linear Sensor Regions," which issued to Goetz et al. on Aug. 1, 2000 and is also assigned to Honeywell International Inc. U.S. Pat. Nos. 5,589,769 and 6,097,183 are incorporated herein by reference in their entirety. Such MR-based devices generally utilize discrete components on a Printed Circuit Board (PCB) assembly to yield the resulting function.

One of the problems with magnetoresistive sensors, particularly anisotropic magnetoresistive (AMR) sensors based on an array configuration, is that such systems typically rely upon the use of an array of magnetoresistive elements configured with equal spacings. In the case of linear arrays, this means that the linear centerline-to-centerline spacings are nominally equal. While appropriate for some configurations, this regular spacing prevents high accuracy sensing. One approach for improving sensing involves introducing additional magnetoresistive elements. This approach, however, only adds to the overall production costs of the sensor device. It is therefore believed that a solution to the problems associated with such prior art sensor devices is the design and configuration of an array based on regular spacing, but on irregular spacing, as discussed in greater detail herein.

BRIEF SUMMARY

The following summary is provided to facilitate an understanding of some of the innovative features unique to the embodiments and is not intended to be a full description. A full appreciation of the various aspects of the embodiments disclosed can be gained by taking the entire specification, claims, drawings, and abstract as a whole.

It is, therefore, one aspect of the present invention to provide for improved sensor methods and systems.

It is another aspect of the present invention to provide for an improved position detection device It is a further aspect of the present invention to provide for an improved AMR sensor.

It is an additional aspect of the present invention to provide for improved linear and rotary sensing applications.

It is yet another aspect of the present invention to provide a magnetoresistive sensor array system wherein magnetoresistive sensing components thereof are spaced from one another in an irregular manner in order to optimize sensor data results thereof.

The aforementioned aspects of the invention and other objectives and advantages can now be achieved as described herein. A magnetoresistive sensor system is disclosed, which includes a plurality of chip carriers, such that each integrated circuit among the plurality of chip carriers is associated with a respective magnetoresistive sensing components. A plurality of magnetoresistive sensing components can be arranged in an array, wherein each magnetoresistive component among the plurality of magnetoresistive components is associated with a respective integrated circuit among the plurality of chip carriers and wherein the plurality of magnetoresistive sensing components comprises sensing components that are spaced irregular from one another in order to optimize the performance of the array and meet requirements of a particular magnetoresistive sensing application.

This can be configured as a linear array or a rotary array, depending upon design considerations. The array can also be configured on a printed circuit board (PCB). In general, by decreasing the spacing between two elements in a particular region of interest, increased accuracy can be achieved over this region. Varying element spacings can be designed into the array to offer varying performance levels by region.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the principles of the disclosed embodiments.

DETAILED DESCRIPTION

The particular values and configurations discussed in these non-limiting examples can be varied and are cited merely to illustrate at least one embodiment and are not intended to limit the scope of the invention.

Figure 1:
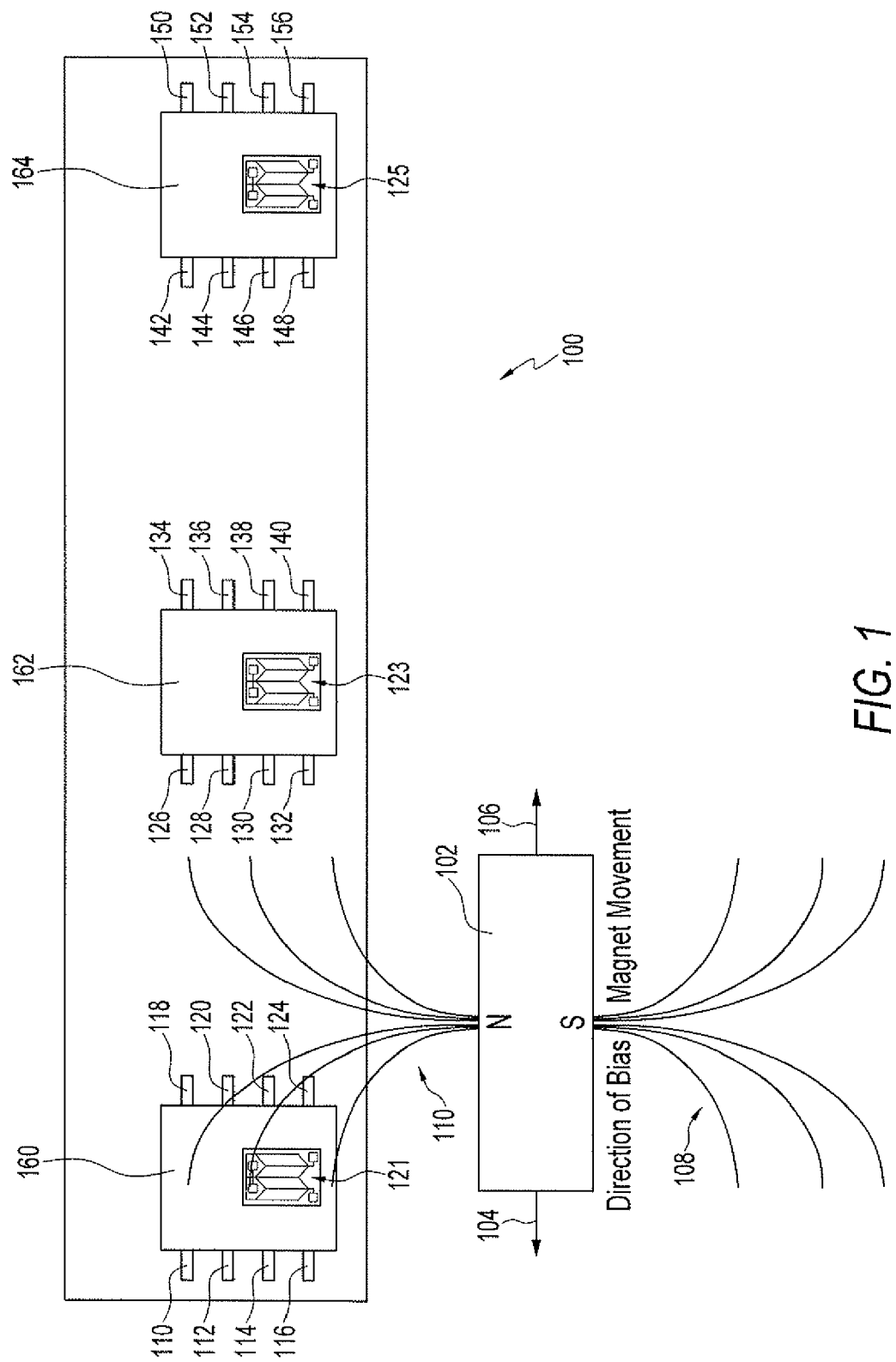
FIG. 1 illustrates a top view of a magnetoresistive array sensor system.

FIG. 1 illustrates a top view of a magnetoresistive sensing system 100, which is described for general illustrative purposes and to depict the context in which a preferred embodiment can be implemented. System 100 generally includes a group of chip carriers, such as, for example, chip carriers 160, 162, and 164, which function as a housing or carrier for maintaining respective magnetoresistive bridge circuits 121, 123 and 125. Bridge circuits 121, 123, and 125 can each be preferably implemented as anisotropic magnetoresistive (AMR) Wheatstone bridge circuits, depending upon design considerations. System 100 further includes a biasing magnet 102. The direction of the bias magnet movement associated with biasing magnet 102 is generally indicated by arrows 104 and 106. Magnetic field lines 110 and 108 associated with magnet 102 are also depicted in FIG. 1.

Chip carrier 160 includes a plurality of electrical connections or pins 110, 112, 114, 116, 118, 120, 122, 124. Similarly, chip carrier 162 includes a plurality of electrical connections or pins 126, 128, 130, 132, 134, 136, 138, 140. Likewise, chip carrier 164 includes a plurality of electrical connections or pins 142, 144, 146, 148, 150, 152, 154, 156. In general the chip carriers 160, 162, 164 and respective AMR bridge circuits 121, 123, 125 can be grouped together to form a magnetoresistive array or system 100. Note that although only three AMR bridge circuits 121, 123, 125 are depicted in FIG. 1, magnetoresistive array 100 can be configured with more or few AMR bridge circuits and associated chip carrier devices, depending upon design considerations. For example, it is possible to implement magnetoresistive array 100 with eight AMR bridge circuits.

The movement of the biasing magnet 102 generates a sinusoidal signal response from each magnetoresistive bridge circuit 121, 123, 125. The AMR bridge outputs generated by magnetoresistive bridge circuits 121, 123, 125 are nearly identical to one another; however, their respective phases are shifted due to centerline-to-centerline spacing thereof. Varying sensing schemes can therefore be implemented to interpolate between the AMR bridge circuits 121, 123, 125 in order to achieve a high absolute accuracy.

Figure 2:
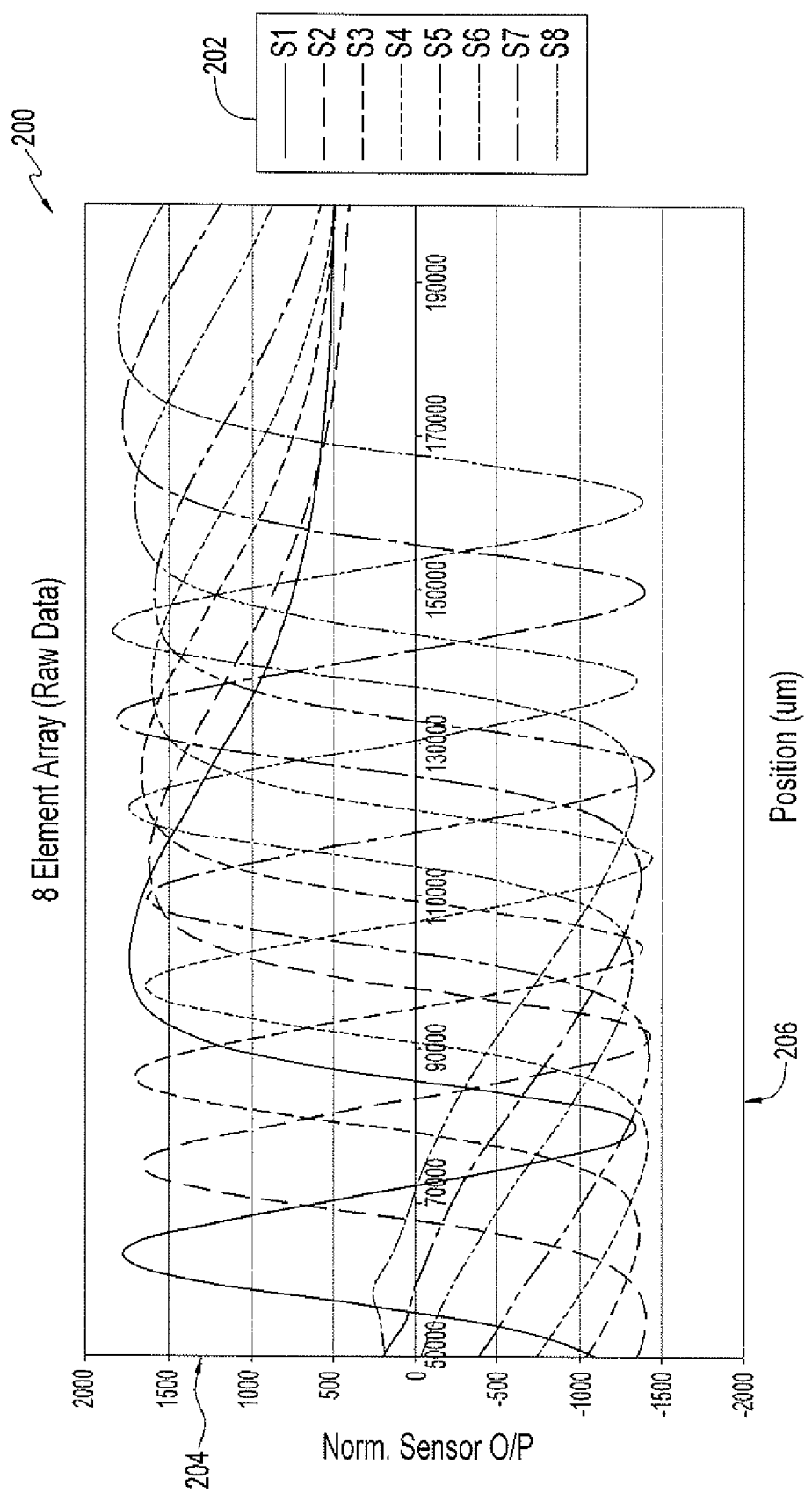
FIG. 2 illustrates a graph depicting example curves for an eight element magnetoresistive array sensor with regular spacing.

FIG. 2 illustrates a graph 200 depicting example curves for an eight element magnetoresistive array sensor with regular spacing. Graph 200 includes a legend 202 which is associated with the data depicted in graph 200. A y-axis 204 generally plots normalize sensor output data, while an x-axis 206 tracks position data in micrometers.

Figure 3:
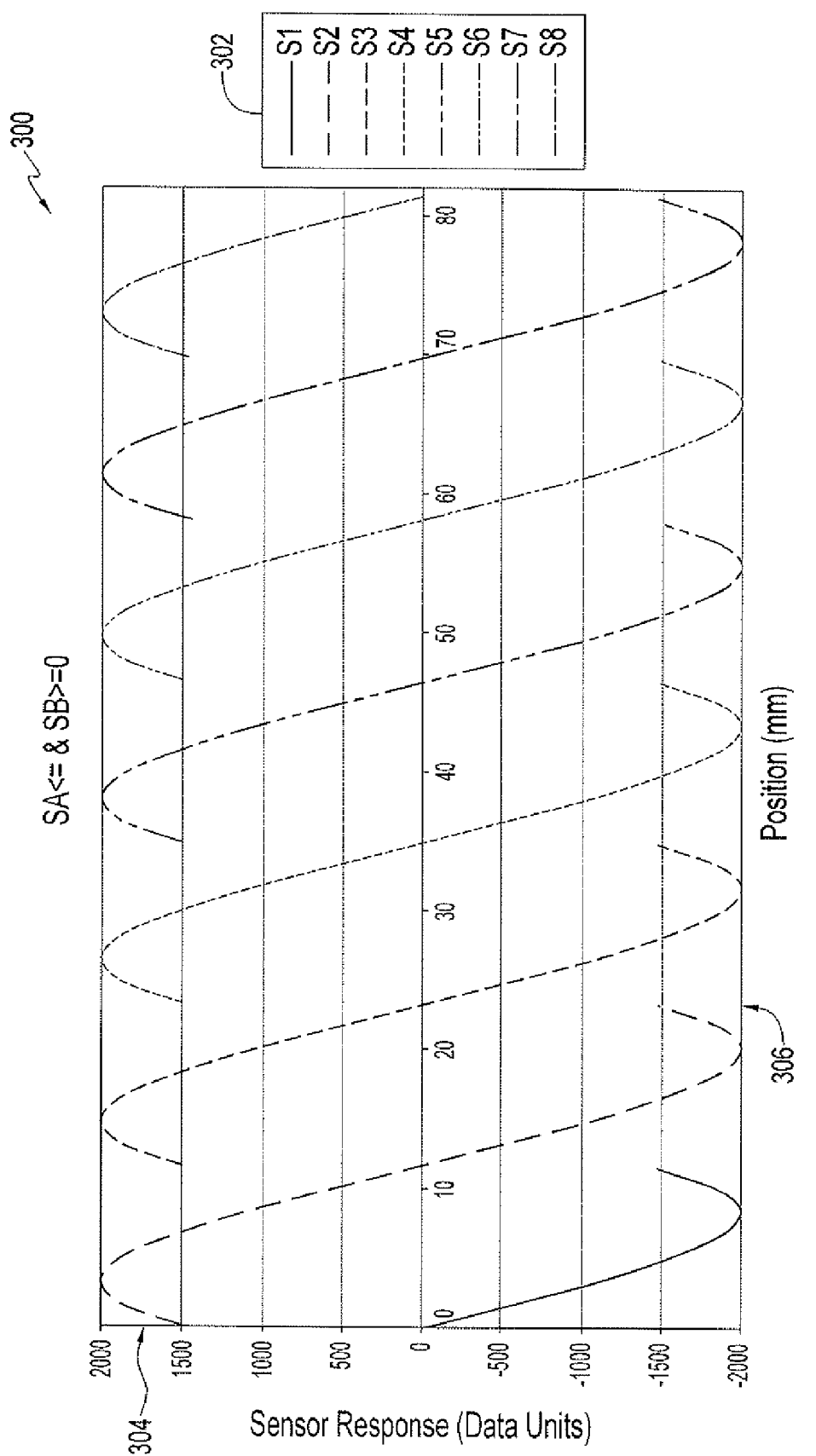
FIG. 3 illustrates a graph depicting normalized and compensated generated as a result of processing a magnetoresistive array algorithm.

FIG. 3 illustrates a graph 300 depicting normalized and compensated generated as a result of processing a magnetoresistive array algorithm. Graph 300 is associated with a legend 302, which tracks data depicted graph 300. A y-axis 304 plots sensor response information in data units, while an x-axis 306 tracks position data in millimeters.

Figure 4:
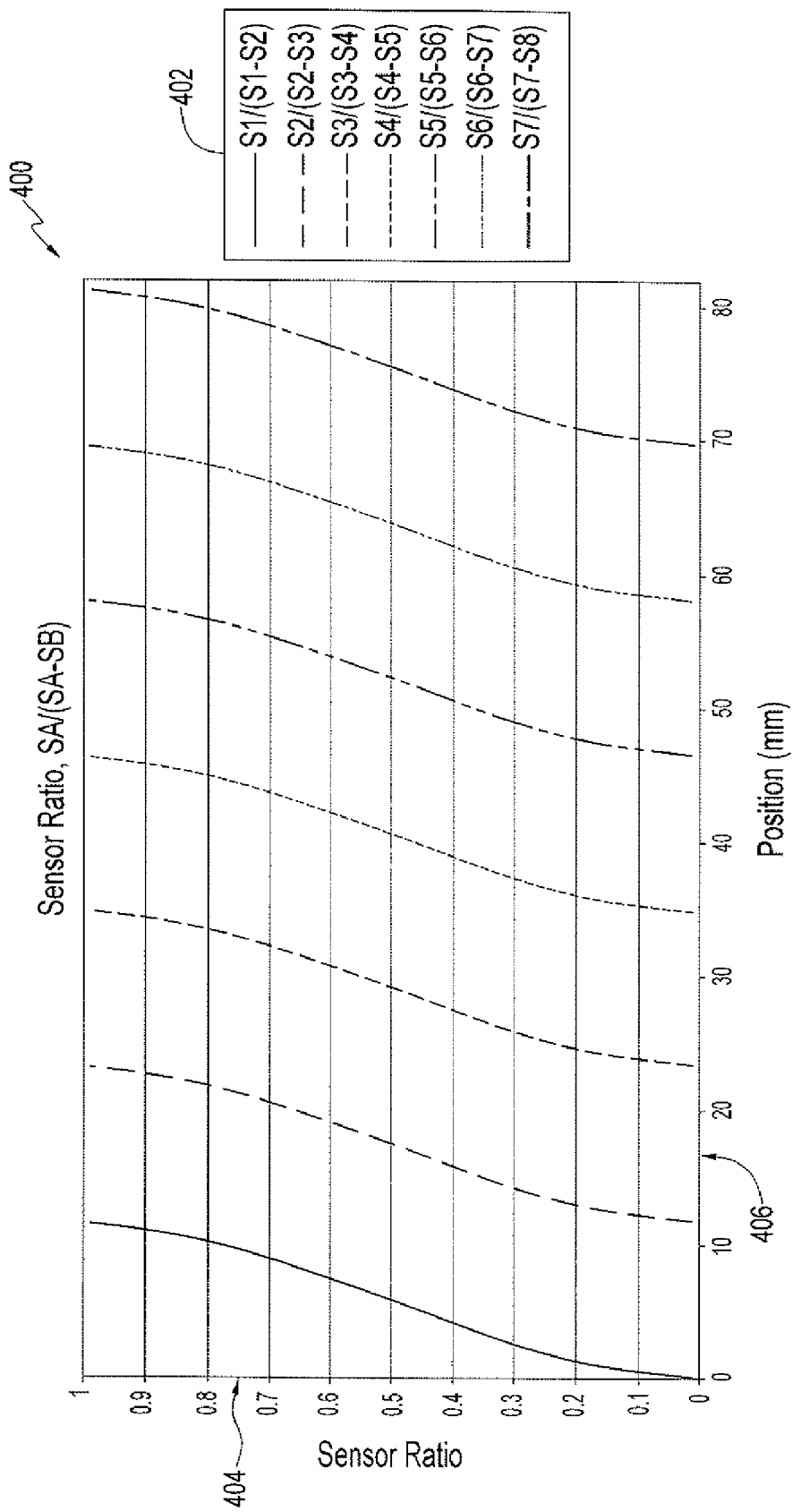
FIG. 4 illustrates a graph depicting data generated by a magnetoresistive array algorithm, wherein sensor ratios remain constant with respect to temperature.

FIG. 4 illustrates a graph 400 depicting data generated by a magnetoresistive array algorithm, wherein sensor ratios remain constant with respect to temperature. Graph 400 includes a legend 402, which is associated with the data plotted in graph 400. A y-axis 402 tracks sensor ration data while an x-axis tracks position data in millimeters. The sensor ratios depicted in graph 400 thus remains constant over temperature. The sensor ratio is generally provided by the formulation SA/(SA-SB), wherein SA is associated with an "A" sensor and sensor SB is associated with a "B" sensor.

Figure 5:
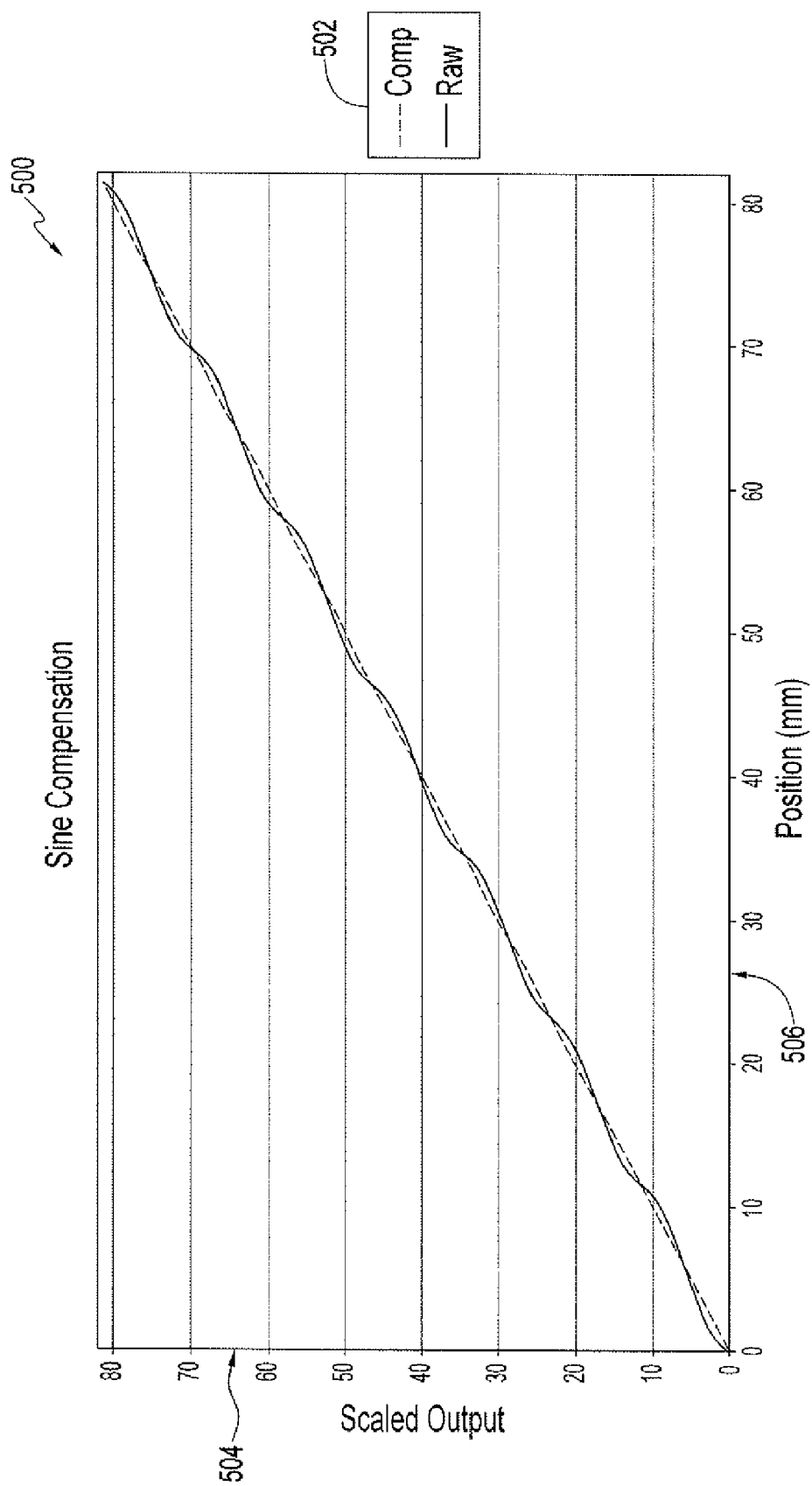
FIG. 5 illustrates a graph depicting data generated by a magnetoresistive array algorithm, wherein such data comprises a straight line fit based on linearization achieved with a Fourier compensation.

FIG. 5 illustrates a graph 500 depicting data generated by a magnetoresistive array algorithm, wherein such data comprises a straight line fit based on linearization achieved with Fourier compensation. A legend 501 is associated with graph 500 and relates to compensated and raw data plotted in graph 500. A y-axis 502 generally tracks scaled output data, while an x-axis 504 tracks position data in millimeters.

Figure 6:
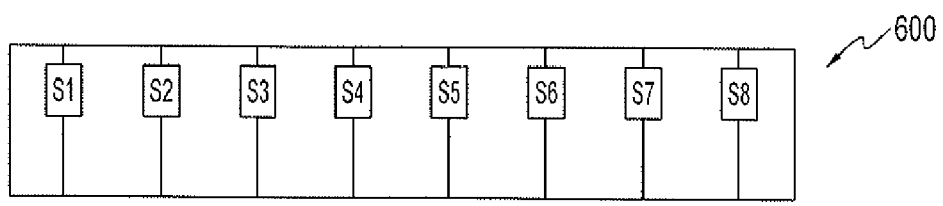
FIG. 6 illustrates an example linear magnetoresistive array that can be implemented based on a PCB configuration.
Figure 7:
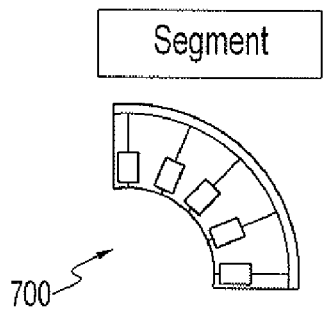
FIG. 7 illustrates an example rotary magnetoresistive array in the form of a segment that can be implemented based on a PCB configuration.
Figure 8:
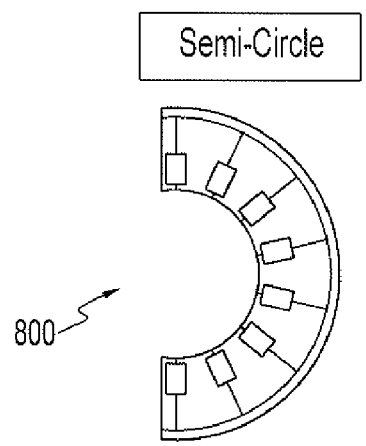
FIG. 8 illustrates an example rotary magnetoresistive array in the form of a semi-circle that can be implemented based on a PCB configuration.
Figure 9:
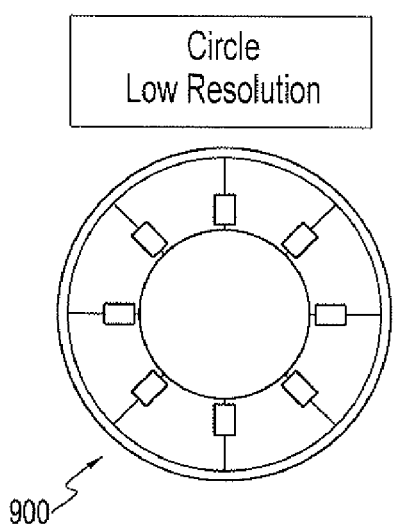
FIG. 9 illustrates an example rotary magnetoresistive array in the form of a low resolution circle that can be implemented based on a PCB configuration.
Figure 10:
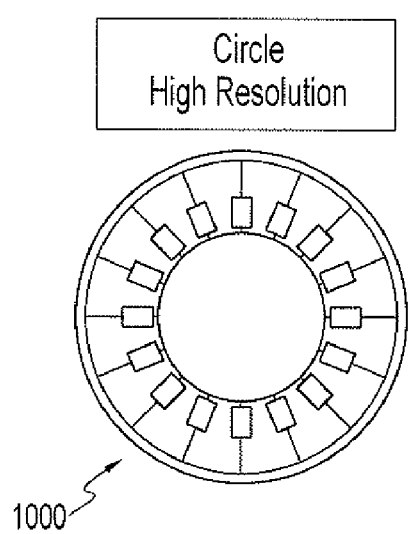
FIG. 10 illustrates an example rotary magnetoresistive array in the form of a high resolution circle that can be implemented based on a PCB configuration.

FIG. 6 illustrates an example linear magnetoresistive array 600 that can be implemented based on a PCB configuration. FIG. 7 illustrates an example rotary magnetoresistive array 700 in the form of a segment that can be implemented based on a PCB configuration. Similarly, FIG. 8 illustrates an example rotary magnetoresistive array 800 in the form of a semi-circle that can be implemented based on a PCB configuration. Likewise, FIG. 9 illustrates an example rotary magnetoresistive array 900 in the form of a low resolution circle that can be implemented based on a PCB configuration. Finally, FIG. 10 illustrates an example rotary magnetoresistive array 1000 in the form of a high resolution circle that can be implemented based on a PCB configuration. The magnetoresistive arrays depicted in FIGS. 6-10 are presented in order to demonstrate that many different magnetoresistive array shapes are possible.

Figure 11:
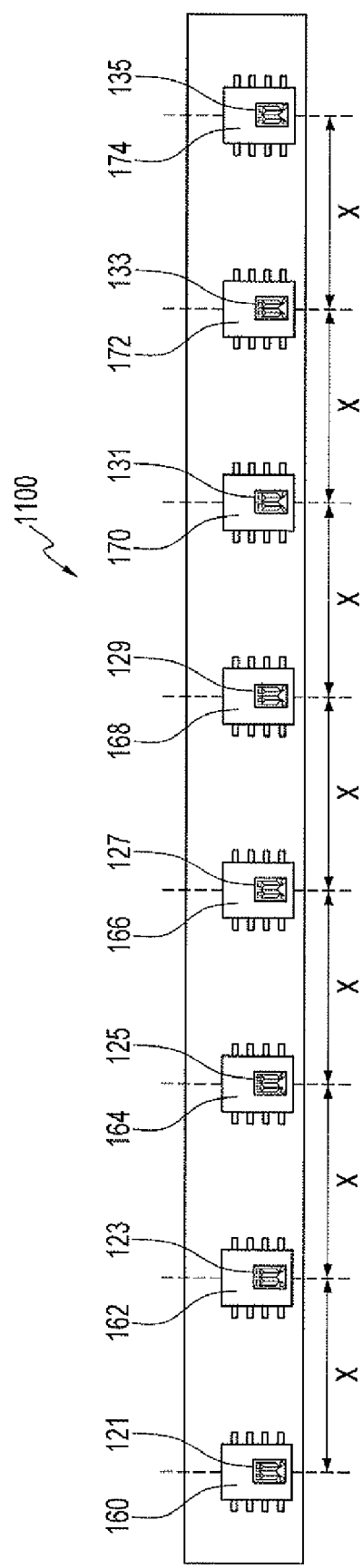
FIG. 11 illustrates an eight element magnetoresistive array sensor system with equal element spacing thereof.

FIG. 11 illustrates an eight element magnetoresistive array sensor system 1100 with equal or regular element spacing thereof. Note that in FIGS. 1 and 11, identical or similar parts or elements are indicated by identical reference numerals. Thus, the eight element magnetoresistive array sensor system 1100 is essentially a variation to the three element configuration of sensor system 100 depicted in FIG. 1. In addition to the inclusion of chip carriers 160, 161, and 164, the eight element magnetoresistive array sensor system 1100 includes chip carriers 166, 168, 170, 172, and 174 which are essentially identical to one or more of chip carriers 160, 161, 165. Chip carriers 166, 168, 170, 172, and 174 are respectively associated with AMR bridge circuits 127, 129, 131, 133, and 135. Spacing between AMR bridge circuits is indicated respectively in FIG. 11 by a length represented by the variable x. In one possible implementation, the variable x can be, for example, 12.00 millimeters.

It is important to appreciate that all previous magnetoresistive array and sensing configurations utilize an array of elements configured with equal spacing. In the case of linear arrays, this means that the linear centerline-to-centerline distance is nominally equal. In the case of rotary arrays, this means that the centerline-to-centerline arc is nominally equal.

Through simulation and analysis, it has been determined that a unique ability exists for optimizing the absolute accuracy in a particular region of an array by decreasing the spacing between the pair of elements in a region of interest. The spacing between the remaining elements within the array can then be increased to preserve the overall length of the array. Example simulated data is therefore described herein, which illustrates the significant performance increase that can be gained utilizing this approach.

Figure 12:
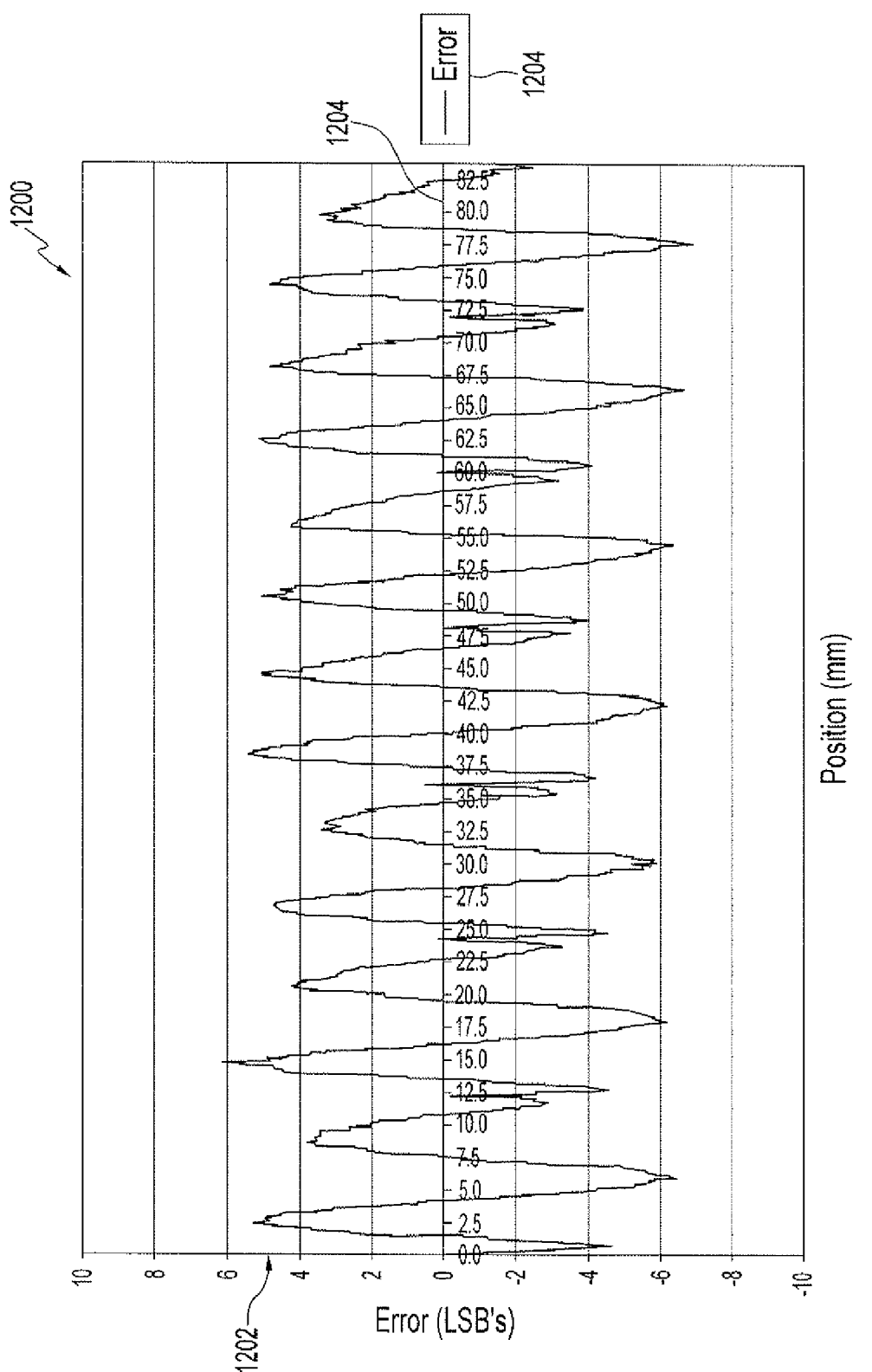
FIG. 12 illustrates a graph depicting data, which can be generated by the eight element magnetoresistive array sensor system depicted in FIG. 11.

FIG. 12 illustrates a graph 1200 depicting data, which can be generated by the eight element magnetoresistive array sensor system 1100 depicted in FIG. 11. Graph 1200 generally includes a legend 1206 which represents the error plot depicted in graph 1200. A y-axis 1202 generally tracks error data in LSB (i.e., "least significant bits" or quantization levels), while an x-axis 1204 tracks position data in millimeters. Graph 1200 illustrates position error data in LSB's at 25 degree Celsius based on data generated from an eight element 84.00 linear magnetoresistive array or system with equal element spacing of 12.00 mm, such as, for example, the eight element magnetoresistive array sensor system 1100 depicted in FIG. 11.

Figure 13:
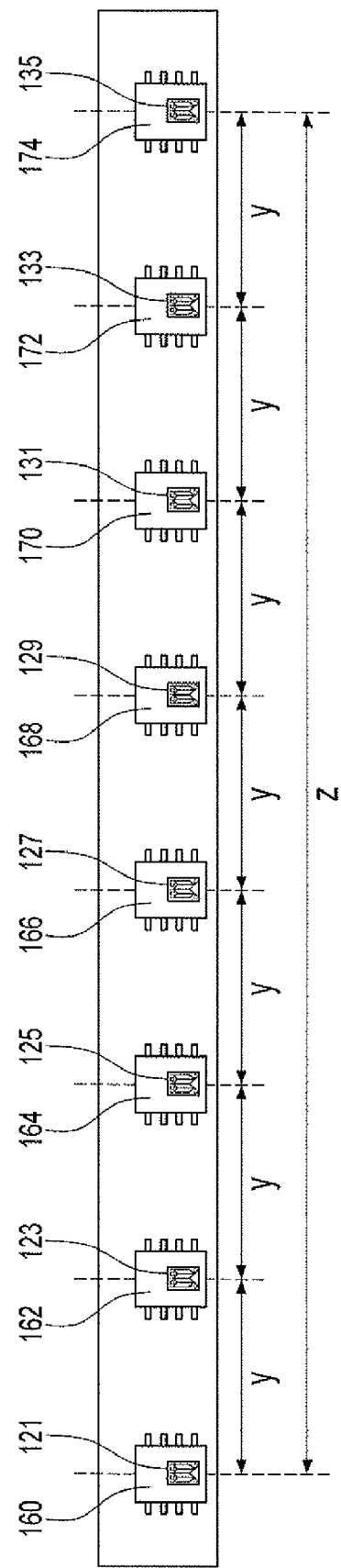
FIG. 13 illustrates an eight element magnetoresistive array sensor system with equal element spacing thereof, wherein such spacing differs from the spacing present in the configuration depicted in FIG. 11.

FIG. 13 illustrates an eight element magnetoresistive array sensor system 1300 with equal element spacing thereof, wherein such spacing differs from the spacing present in the configuration depicted in FIG. 11. Magnetoresistive array sensor 1300 is also configured with equal spacing of "y" lengths and a total length of "z". In one potential implementation, the variable y can represent a length of 9.43 millimeters, while the variable z can represent a total length of 66.00 millimeters. Thus, the magnetoresistive array sensor system 1300 can be implemented as an eight element, 66.00 mm linear array with equal spacing of 9.43 mm.

Figure 14:
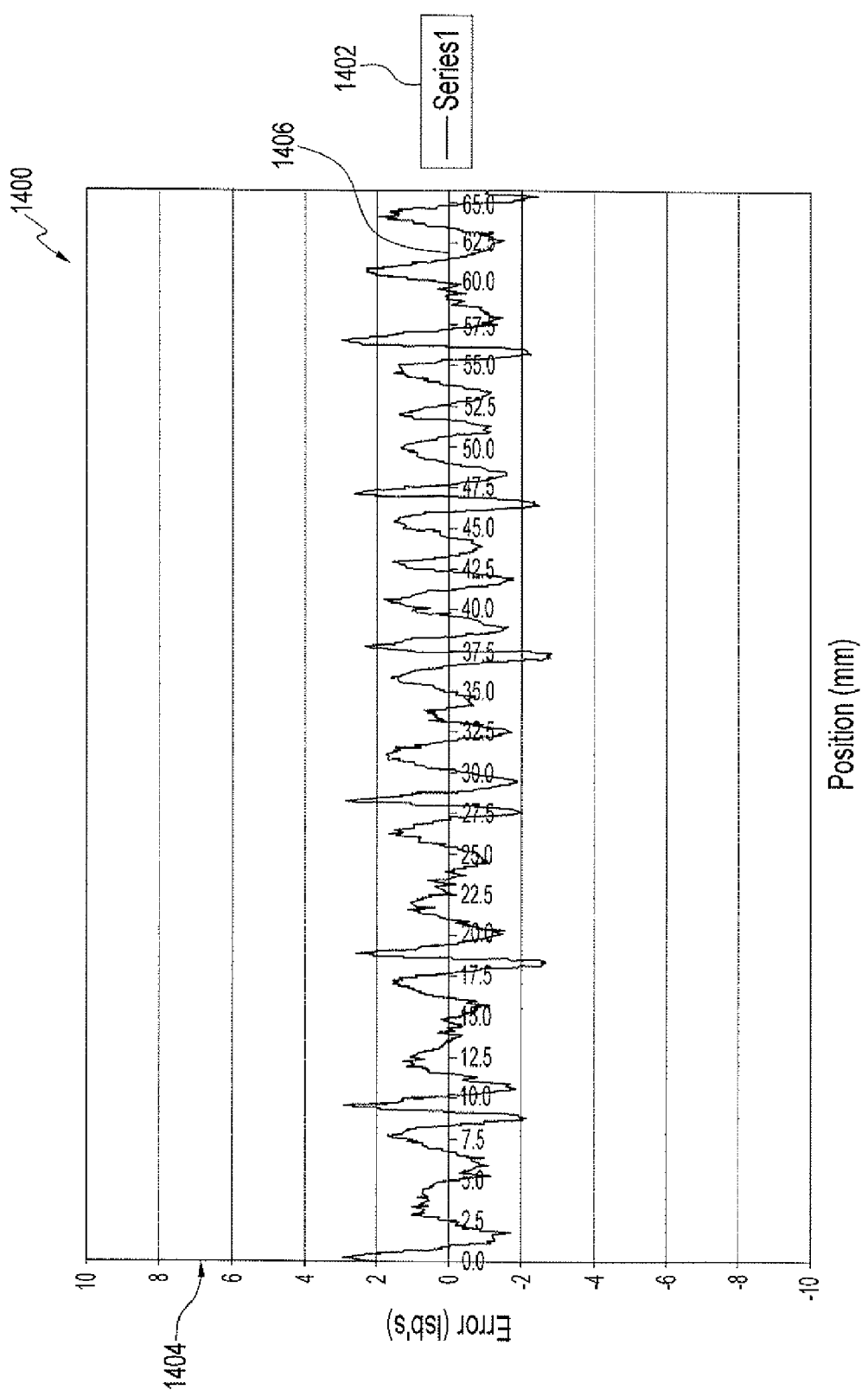
FIG. 14 illustrates a graph depicting data, which can be generated by the eight element magnetoresistive array sensor system depicted in FIG. 13.

FIG. 14 illustrates a graph 1400 depicting data, which can be generated by the eight element magnetoresistive array sensor system 1300 depicted in FIG. 13. Graph 1400 is associated with a legend 1402 associated with the data plotted in graph 1400. A y-axis 1404 tracks error data in LSB's, while an x-axis 1406 tracks position data in millimeters. Graph 1400 therefore depicts the absolute position error in LSB's at 24 degrees Celsius for an eight element, 66.00 mm linear array with equal spacing of 9.43 mm.

Figure 15:
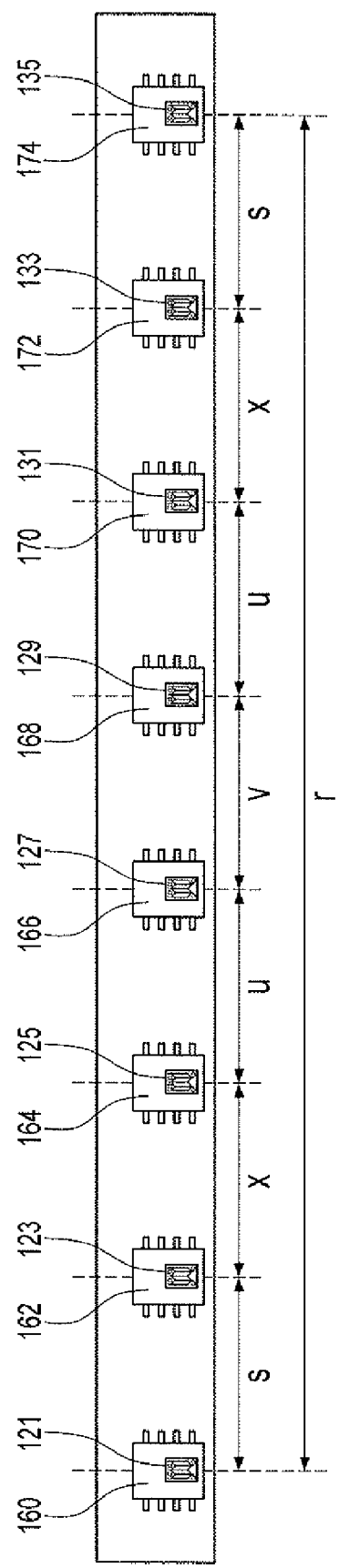
FIG. 15 illustrates an eight element magnetoresistive array sensor system with irregular element spacing thereof, in accordance with a preferred embodiment.

FIG. 15 illustrates an eight element magnetoresistive array sensor system 1500 with irregular element spacing thereof, in accordance with a preferred embodiment. Note that in FIGS. 11, 13 and 15, identical or similar parts or components are indicated by identical reference numerals. System 1500 differs from the systems depicted in FIGS. 11, 13 and 15 in that system 1500 illustrates irregular spacing. For example, a length "s" is located between AMR bridge circuit 121 and AMR bridge circuit 123, while a length "t" is present between AMR bridge circuit 123 and AMR bridge circuit 125. Similarly, a different length "u" is present between AMR bridge circuit 125 and AMR bridge circuit 127. Likewise, a different length "v" is located between AMP bridge circuit 127 and AMR bridge circuit 129, and so forth.

The total length from the centerline of AMR bridge circuit 121 to the centerline of AMR bridge circuit 135 is represented by the variable "r". Thus, in some implementations, the length "s" can be, for example, 12.00 mm, while the length "t" may be 10.00 mm. In such an implementation, the length "u" may be 8.00 mm, while the length or spacing "v" can be 6.00 mm. The length or spacing associated with the length "r" can be, for example, 66.00 mm. Thus, the eight element magnetoresistive array sensor system 1500 can be implemented, for example, as an eight element, 66.00 mm linear array with irregular spacing.

Figure 16:
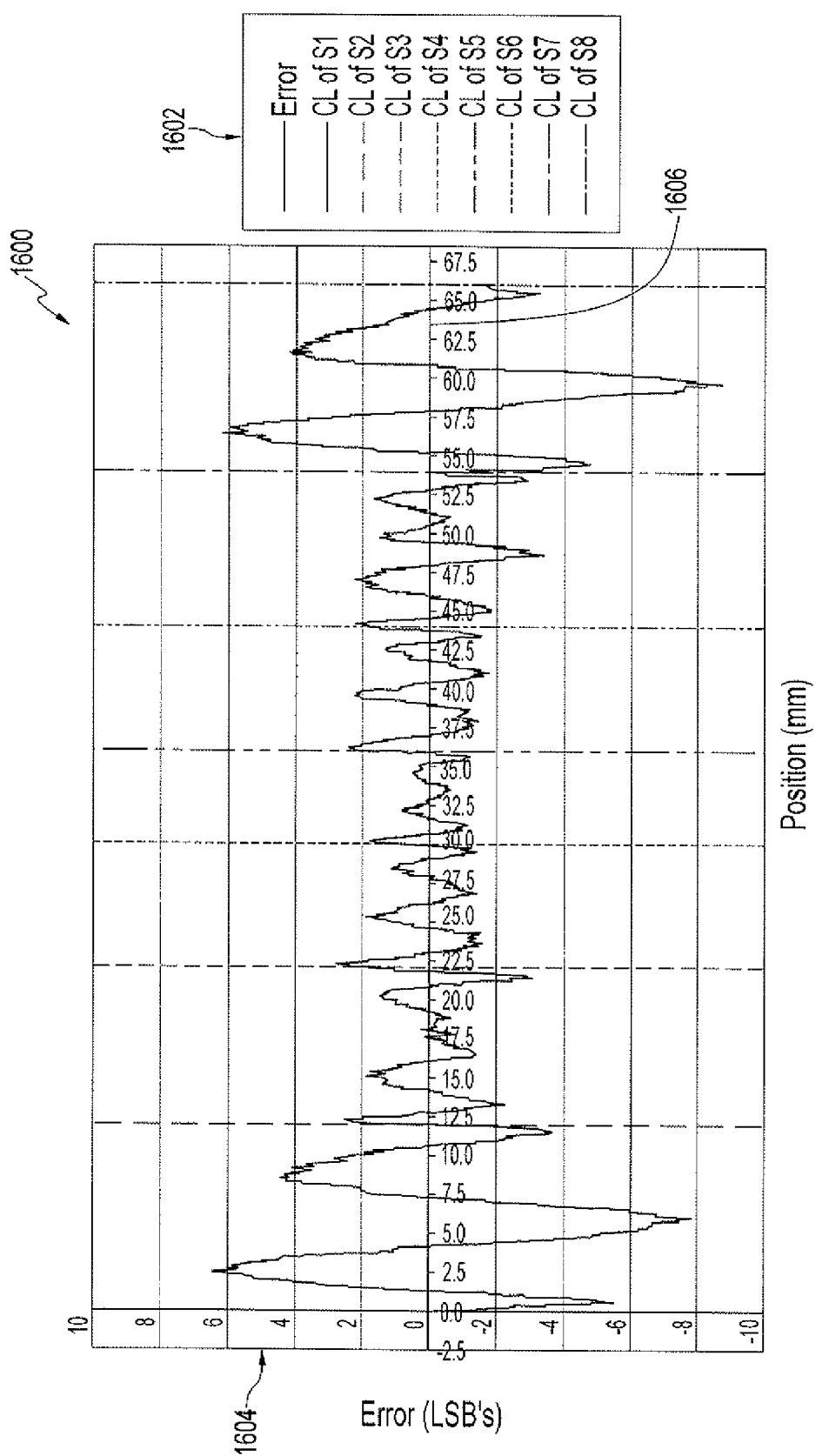
FIG. 16 illustrate a graph depicting data, which can be generated by the magnetoresistive array sensor system depicted in FIG. 15.

FIG. 16 illustrates a graph 1600 depicting data, which can be generated by the magnetoresistive array sensor system 1500 depicted in FIG. 15. Graph 1600 is associated with a legend 1602, which represents the data plotted in graph 1600. A y-axis 1604 generally tracks error data in LSB's, while an x-axis 1606 plots position data in millimeters. Graph 1600 generally represents the absolute position error in LSB's at 25 degrees Celsius base don an 8 element, 66.00 mm, linear magnetoresistive array with irregular spacing, such as that depicted in FIG. 15.

From the foregoing, it can be postulated that the Absolute Position Accuracy is a function of the amount of quantization levels (least significant bits or LSB's) per pair of elements and the spacing between those elements. The amount of quantization levels is determined by the electronic design and is fixed. However, the element spacing is a function of the magnetic circuit design and is easily optimized per application. Absolute accuracy is improved if the element spacing are moved closer together, but may be worsened if the element spacings are moved further apart.

If a high level of accuracy is desired across the whole length of the array, then a sufficient amount of elements must be utilized. However, if there is one particular region of interest within the array where a very high level of accuracy is desired but the accuracy does not have to be as high for the rest of the array, fewer elements may be utilized in the design. Only the particular area of interest where the high level of accuracy is desired needs to have small element spacing.

The previous figures generally rely upon linear magnetoresistive array configurations, which provide examples that explain the novelty of implementing irregular element spacings. This concept also applies to all rotary magnetoresistive array configurations as well, some examples of which are provided in greater detail as follows.

Figure 17:
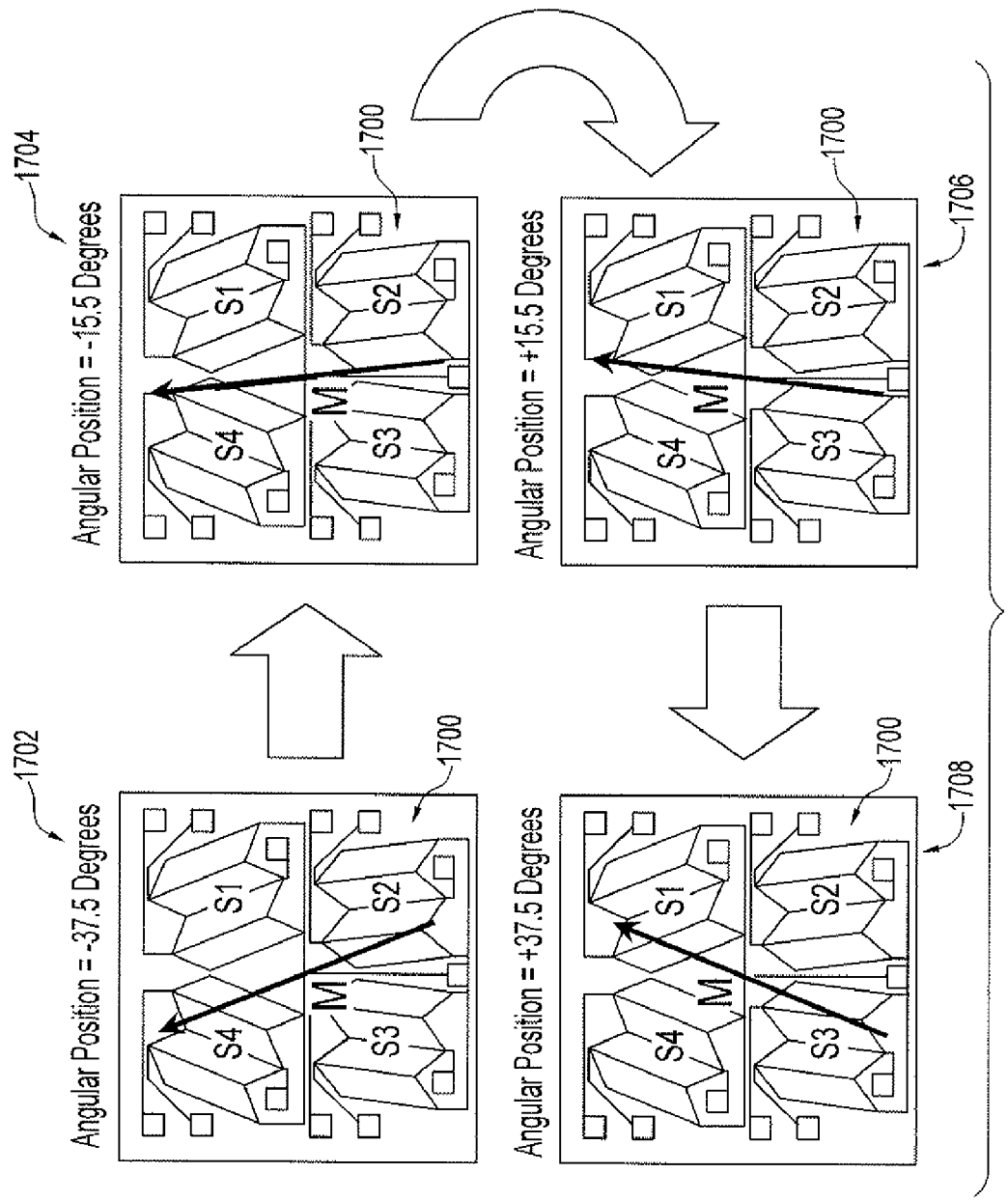
FIG. 17 illustrates a rotary magnetoresistive array sensor system with wider angular spacing in accordance with an alternative embodiment.

FIG. 17 illustrates a rotary magnetoresistive array sensor system 1700 with a wider angular spacing in accordance with an alternative embodiment. System 1700 is generally composed of four magnetoresistive sensing components S4, S1, S3 and S2. An arrow M represents the angular position or magnetic vector associated with system 1700. As indicated at block 1702, system 1700 is indicated at an angular position of −37.5 degrees, while at block 1704, system 1700 is illustrated at an angular position of −15.5 degrees. Thereafter, at block 1706, system 1700 is depicted at an angular position of +15.5 degrees. Finally, as indicated at block 1708, system 1700 is depicted at an angular position of +37.5 degrees.

The process depicted in FIG. 17 indicates that as the bias magnet or magnetic circuit rotates in an angle, the resulting field on the die appears to be a uniform vector rotating about similar to the hand on a clock. The centerline of S1 goes from −37.5 degrees to −15.5 degrees, then to +15.5 degrees and finally to +37.5 degrees. The angular spacings between magnetoresistive components or AMR elements can be provided as follows: (a) S1 & S2=22.0 degrees; (b) S2 & S3=31.0 degrees; and (c) S3 & S4=22.0 degrees.

Figure 18:
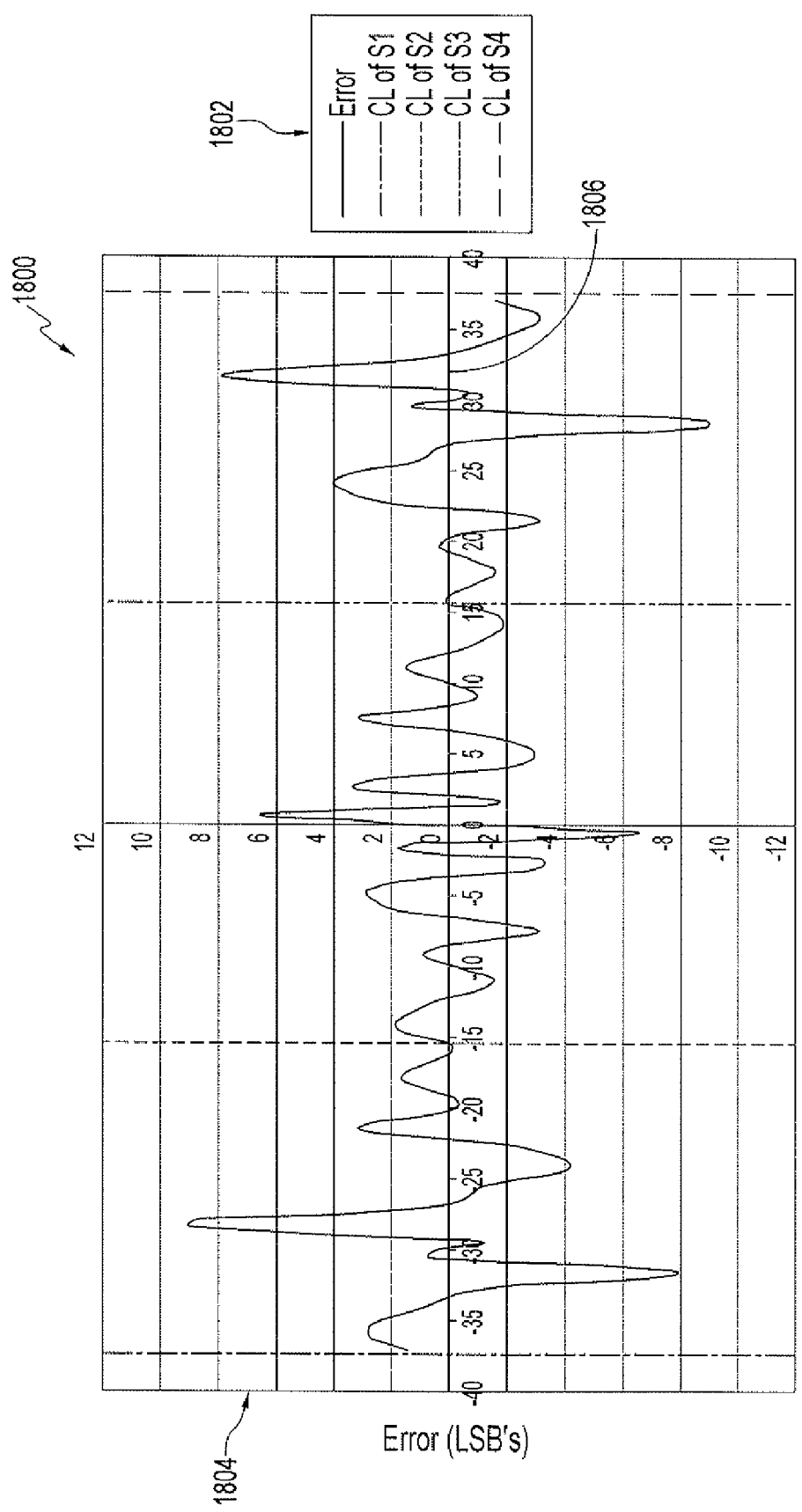
FIG. 18 illustrates a graph depicting data, which can be generated by the rotary magnetoresistive array sensor system depicted in FIG. 17, in accordance with an alternative embodiment.

FIG. 18 illustrates a graph 1800 depicting data, which can be generated by the rotary magnetoresistive array sensor system 1700 depicted in FIG. 17, in accordance with an alternative embodiment. Graph 1800 is generally associated with a legend 1802 which provides a key indicative of the data plotted in graph 1800. A y-axis 1804 generally tracks error data in LSB's, while an x-axis 1806 tracks angular data in degrees. Graph 1800 generally plots example data generated from a four element, 75.0 degree rotary array with 31.0 angular spacing at zero. Graph 1800 is based on an absolute position error in LSB's at 25 degrees Celsius.

Figure 19:
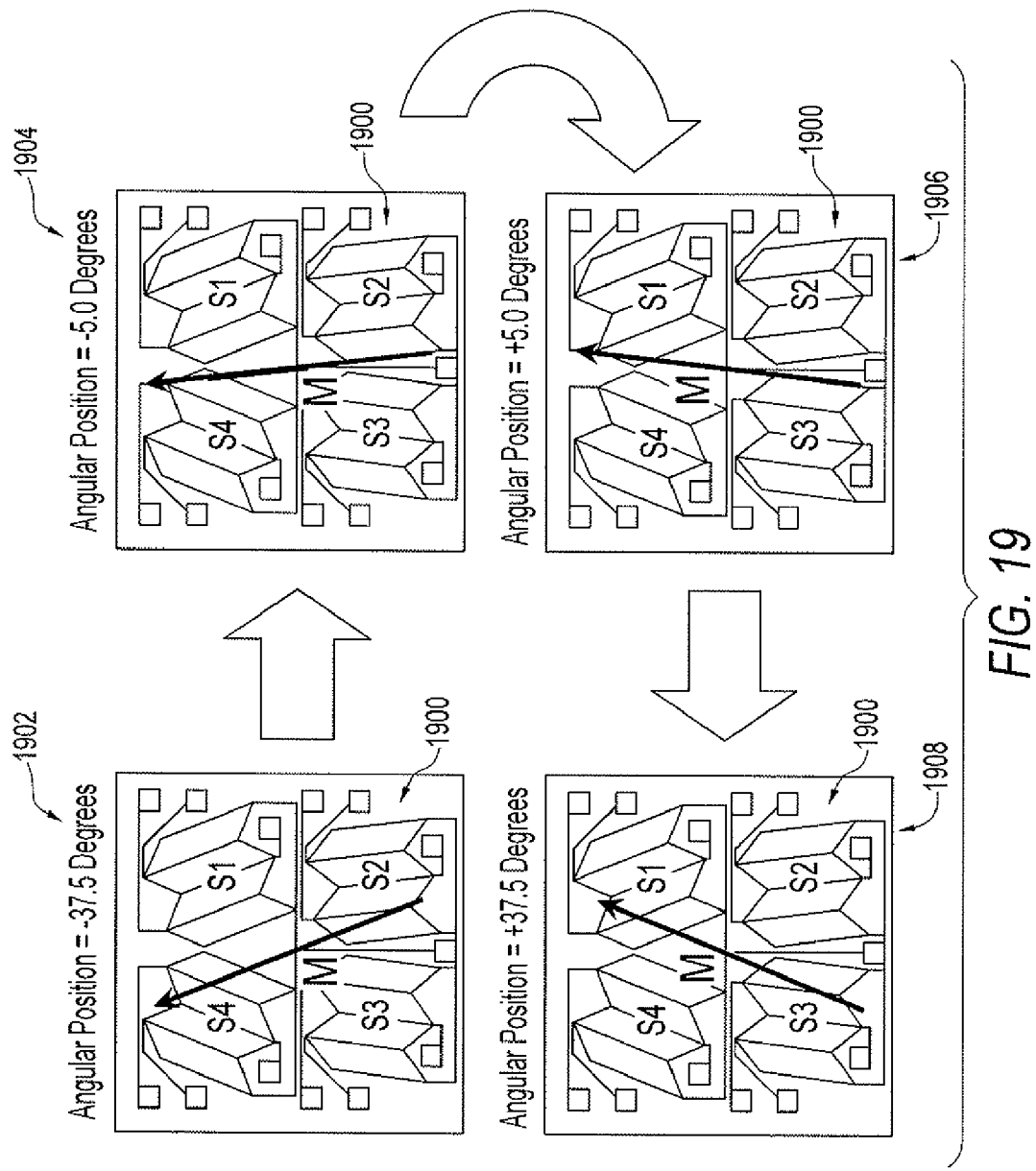
FIG. 19 illustrates a rotary magnetoresistive array sensor system with narrower angular spacing in accordance with an alternative embodiment.

FIG. 19 illustrates a rotary magnetoresistive array sensor system 1900 with narrower angular spacing in accordance with an alternative embodiment. System 1900 is generally composed of four magnetoresistive sensing components S4, S1, S3 and S2. An arrow M represents the angular position or magnetic vector associated with system 1900. As indicated at block 1902, system 1900 is indicated at an angular position of −37.5 degrees, while at block 1904, system 1900 is illustrated at an angular position of −5.0 degrees. Thereafter, at block 1906, system 1900 is depicted at an angular position of +5.0 degrees. Finally, as indicated at block 1908, system 1900 is depicted at an angular position of +37.5 degrees.

The process depicted in FIG. 19 indicates that as the bias magnet or magnetic circuit rotates in an angle, the resulting field on the die appears to be a uniform vector rotating about similar to the hand on a clock. The centerline of S1 goes from −37.5 degrees to −5.0 degrees, then to +5.0 degrees and finally to +37.5 degrees. The angular spacings between magnetoresistive components or AMR elements can be provided as follows: (a) S1 & S2=32.5 degrees; (b) S2 & S3=10.0 degrees; and (c) S3 & S4=32.5 degrees.

Figure 20:
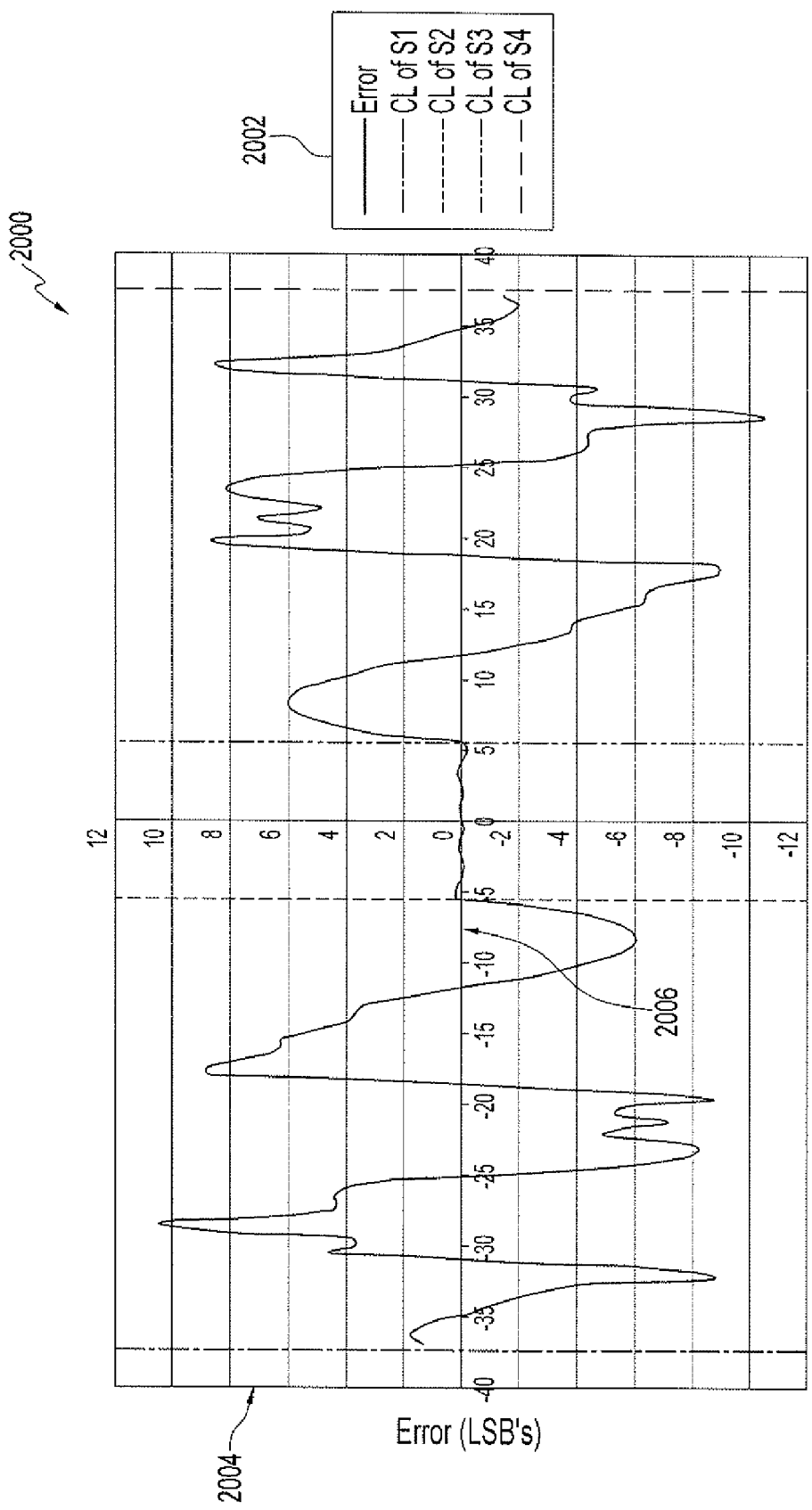
FIG. 20 illustrates a graph depicting data, which can be generated by the rotary magnetoresistive array sensor system depicted in FIG. 19, in accordance with an alternative embodiment.

FIG. 20 illustrates a graph 2000 depicting data, which can be generated by the rotary magnetoresistive array sensor system 1900 depicted in FIG. 19, in accordance with an alternative embodiment. Graph 2000 generally illustrates the absolute position error in LSB's at 25 degrees Celsius and is based on data generated by a four element 75 degree rotary array with 10 degree angular spacing at zero. A legend 2002 provides a key to the data plotted in graph 2000, while a y-axis 2004 tracks error data in LSB's. An x-axis 2006 tracks angular data in degrees.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A magnetoresistive sensor system, comprising:
    a plurality of magnetoresistive sensing components arranged in an array, wherein each magnetoresistive sensing component among said plurality of sensing components is spaced irregular from one another in order to optimize the performance of said array and meet a requirement of a particular magnetoresistive sensing application thereof, wherein the irregular spacing includes three or more different spacings between the plurality of magnetoresistive sensing components including a first spacing between a first magnetoresistive sensing component and a second magnetoresistive sensing component, a second spacing between the second magnetoresistive sensing component and a third magnetoresistive sensing component, and a third spacing between the third magnetoresistive sensing component and a fourth magnetoresistive sensing component; and
    a plurality of chip carriers, wherein each chip carrier among said plurality of chip carriers is associated with a respective magnetoresistive component among said plurality of magnetoresistive components.

2. The system of claim 1 wherein said array is configured on a printed circuit board (PCB).

3. A magnetoresistive sensor system, comprising:
    a plurality of magnetoresistive sensing components arranged in an array, wherein selected magnetoresistive sensing components among said plurality of sensing components are spaced irregular from one another in order to optimize the performance of said array and meet a requirement of a particular magnetoresistive sensing application, wherein the irregular spacing includes three or more different spacings between the plurality of magnetoresistive sensing components including a first spacing between a first magnetoresistive sensing component and a second magnetoresistive sensing component, a second spacing between the second magnetoresistive sensing component and a third magnetoresistive sensing component, and a third spacing between the third magnetoresistive sensing component and a fourth magnetoresistive sensing component, wherein a decrease in a spacing between a pair of magnetoresistive components among said plurality of magnetoresistive components in a region of interest results in an increase in accuracy in said region of interest with said array.

4. A magnetoresistive sensor system, comprising:
a plurality of magnetoresistive sensing components arranged in a rotary array, wherein each magnetoresistive sensing component among said plurality of sensing components is spaced irregular from one another in order to optimize the performance of said rotary array and meet a requirement of a particular magnetoresistive sensing application thereof, wherein the irregular spacing includes three or more different spacings between the plurality of magnetoresistive sensing components including a first spacing between a first magnetoresistive sensing component and a second magnetoresistive sensing component, a second spacing between the second magnetoresistive sensing component and a third magnetoresistive sensing component, and a third spacing between the third magnetoresistive sensing component and a fourth magnetoresistive sensing component.

5. A magnetoresistive sensor system, comprising:
a plurality of magnetoresistive sensing components arranged in a rotary array, wherein each magnetoresistive sensing component among said plurality of sensing components is spaced irregular from one another in order to optimize the performance of said rotary array and meet a requirement of a particular magnetoresistive sensing application thereof, wherein the irregular spacing includes three or more different spacings between the plurality of magnetoresistive sensing components including a first spacing between a first magnetoresistive sensing component and a second magnetoresistive sensing component, a second spacing between the second magnetoresistive sensing component and a third magnetoresistive sensing component, and a third spacing between the third magnetoresistive sensing component and a fourth magnetoresistive sensing component, wherein each magnetoresistive component among said plurality of magnetoresistive components comprises an AMR transducer.

6. The system of claim 3 further comprising an integrated circuit that receives data from each magnetoresistive component.

7. A magnetoresistive sensor system, comprising:
a plurality of magnetoresistive sensing components arranged in an array configured on a printed circuit board (PCB);
a plurality of chip carriers, wherein each chip carrier among said plurality of chip carriers is associated with a respective magnetoresistive component among said plurality of magnetoresistive components, such that each magnetoresistive sensing component among said plurality of sensing components is spaced irregular from one another in order to optimize the performance of said array and meet a requirement of a particular magnetoresistive sensing application thereof, wherein the irregular spacing includes three or more different spacings between the plurality of magnetoresistive sensing components including a first spacing between a first magnetoresistive sensing component and a second magnetoresistive sensing component, a second spacing between the second magnetoresistive sensing component and a third magnetoresistive sensing component, and a third spacing between the third magnetoresistive sensing component and a fourth magnetoresistive sensing component; and
wherein a decrease in a spacing between a pair of magnetoresistive components among said plurality of magnetoresistive components in a region of interest results in an increase in accuracy in said region of interest with said array.

8. The system of claim 7 wherein each magnetoresistive component among said plurality of magnetoresistive components comprises an AMR bridge circuit.

9. A magnetoresistive sensor method, comprising:
arranging a plurality of magnetoresistive sensing components in an array;
configuring said plurality of magnetoresistive sensing components such that each magnetoresistive sensing component among said plurality of sensing components is spaced irregular from one another in order to optimize the performance of said array and meet a requirement of a particular magnetoresistive sensing application thereof, wherein the irregular spacing includes three or more different spacings between the plurality of magnetoresistive sensing components including a first spacing between a first magnetoresistive sensing component and a second magnetoresistive sensing component, a second spacing between the second magnetoresistive sensing component and a third magnetoresistive sensing component, and a third spacing between the third magnetoresistive sensing component and a fourth magnetoresistive sensing component;
providing a plurality of chip carriers; and
associating each chip carrier among said plurality of chip carriers with a respective magnetoresistive component among said plurality of magnetoresistive components.

10. A magnetoresistive sensor method, comprising:
arranging a plurality of magnetoresistive sensing components in a rotary array;
configuring said plurality of magnetoresistive sensing components such that each magnetoresistive sensing component among said plurality of sensing components is spaced irregular from one another in order to optimize the performance of said rotary array and meet a requirement of a particular magnetoresistive sensing application thereof, wherein the irregular spacing includes three or more different spacings between the plurality of magnetoresistive sensing components including a first spacing between a first magnetoresistive sensing component and a second magnetoresistive sensing component, a second spacing between the second magnetoresistive sensing component and a third magnetoresistive sensing component, and a third spacing between the third magnetoresistive sensing component and a fourth magnetoresistive sensing component, wherein a spacing between a pair of magnetoresistive components among said plurality of magnetoresistive components is less in a region of interest in order achieve an increased accuracy in said region of interest with said rotary array.

11. A magnetoresistive sensor method, comprising:
arranging a plurality of magnetoresistive sensing components in a rotary array;
configuring said plurality of magnetoresistive sensing components such that each magnetoresistive sensing component among said plurality of sensing components is spaced irregular from one another in order to optimize the performance of said rotary array and meet a requirement of a particular magnetoresistive sensing application thereof, wherein the irregular spacing includes three or more different spacings between the plurality of magnetoresistive sensing components including a first spacing between a first magnetoresistive sensing component and a second magnetoresistive sensing component, a second spacing between the second magnetoresistive sensing component and a third magnetoresistive sensing component, and a third spacing between the third magnetoresistive sensing component and a fourth magnetoresistive sensing component, wherein each magnetoresistive component among said plurality of magnetoresistive components comprises an AMR bridge circuit.

12. The method of claim 9 further comprising:
providing a decreased spacing between a pair of magnetoresistive components among said plurality of magnetoresistive components in a region of interest in order achieve an increased accuracy in said region of interest with said array.

13. The method of claim 12 wherein each magnetoresistive component among said plurality of magnetoresistive components comprises an AMR bridge circuit.

14. A magnetoresistive sensor method, comprising:
arranging a plurality of magnetoresistive sensing components in a rotary array;
configuring said plurality of magnetoresistive sensing components such that each magnetoresistive sensing component among said plurality of sensing components is spaced irregular from one another in order to optimize the performance of said rotary array and meet a requirement of a particular magnetoresistive sensing application thereof, wherein the irregular spacing includes three or more different spacings between the plurality of magnetoresistive sensing components including a first spacing between a first magnetoresistive sensing component and a second magnetoresistive sensing component, a second spacing between the second magnetoresistive sensing component and a third magnetoresistive sensing component, and a third spacing between the third magnetoresistive sensing component and a fourth magnetoresistive sensing component, wherein each magnetoresistive component among said plurality of magnetoresistive components comprises an AMR transducer.

15. The method of claim 9 further comprising providing an integrated circuit that receives data from each magnetoresistive component.

16. The method of claim 9, wherein each magnetoresistive component among said plurality of magnetoresistive components comprises an AMR transducer, and a spacing between a pair of magnetoresistive components among said plurality of magnetoresistive components is less in a region of interest in order achieve an increased accuracy in said region of interest with said array.

17. The method of claim 16 further comprising providing an integrated circuit that receives data from each magnetoresistive component among said plurality of magnetoresistive components.

18. The method of claim 9 wherein said array is a rotary array, and further comprising configuring said rotary array with a wide angular spacing.

* * * * *